(12) United States Patent
Lee et al.

(10) Patent No.: US 12,386,192 B2
(45) Date of Patent: Aug. 12, 2025

(54) REFLECTIVE POLARIZER AND DISPLAY SYSTEM

(71) Applicant: 3M INNOVATIVE PROPERTIES COMPANY, St. Paul, MN (US)

(72) Inventors: Seo-Hern Lee, Gyeonggi-do (KR); Adam D. Haag, Woodbury, MN (US); Martin E. Denker, Vadnais Heights, MN (US); Timothy J. Nevitt, Red Wing, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 524 days.

(21) Appl. No.: 17/800,295

(22) PCT Filed: Mar. 4, 2021

(86) PCT No.: PCT/IB2021/051819
§ 371 (c)(1),
(2) Date: Aug. 17, 2022

(87) PCT Pub. No.: WO2021/181224
PCT Pub. Date: Sep. 16, 2021

(65) Prior Publication Data
US 2023/0099780 A1 Mar. 30, 2023

Related U.S. Application Data

(60) Provisional application No. 62/986,869, filed on Mar. 9, 2020.

(51) Int. Cl.
| | |
|---|---|
| *G02B 27/28* | (2006.01) |
| *G02B 5/20* | (2006.01) |
| *G02B 5/26* | (2006.01) |
| *G02B 5/30* | (2006.01) |
| *H10K 50/86* | (2023.01) |
| *H10K 59/35* | (2023.01) |

(52) U.S. Cl.
CPC .......... *G02B 27/288* (2013.01); *G02B 5/201* (2013.01); *G02B 5/26* (2013.01); *G02B 5/3025* (2013.01); *H10K 50/86* (2023.02); *H10K 59/35* (2023.02)

(58) Field of Classification Search
CPC ...... G02B 27/288; G02B 27/28; G02B 5/201; G02B 5/26; G02B 5/3025; G02B 5/20;
(Continued)

(56) References Cited

U.S. PATENT DOCUMENTS 5,882,774 A 3/1999 Jonza et al.
6,179,948 B1 1/2001 Merrill et al.
(Continued)

FOREIGN PATENT DOCUMENTS

JP 2014142367 A 8/2014
KR 100507777 B1 8/2005
(Continued)

OTHER PUBLICATIONS

International Search Report for PCT Application No. PCT/IB2021/051819, mailed on May 4, 2021, 3 pages.

*Primary Examiner* — Stephone B Allen
*Assistant Examiner* — Adam W Booher
(74) *Attorney, Agent, or Firm* — Clifton F. Richardson

(57) ABSTRACT

A reflective polarizer has substantially distinct blue, green and red-infrared reflection bands for substantially normally incident light. A display system includes a display panel including blue, green and red light emitting pixels having respective blue, green and red peak wavelengths and respective blue, green and red FWHMs; and the reflective polarizer disposed on the light emitting pixels. The reflective polarizer: reflects at least about 60% of the incident light for each of the blue and green peak wavelengths and at least about 40% of the incident light for the red peak wavelength for a (Continued)

first polarization state; transmits at least about 60% of the incident light for each of the blue, green and red peak wavelengths for an orthogonal second polarization state; and has an absorption peak at a wavelength between the green and red FWHMs.

15 Claims, 9 Drawing Sheets

(58) Field of Classification Search
CPC .... G02B 5/28; G02B 5/281–289; G02B 5/39; G02B 5/3033–305; H10K 59/35; H10K 59/8791; H10K 59/8793; H10K 50/86; H10K 50/868
See application file for complete search history.

(56) References Cited

U.S. PATENT DOCUMENTS

| | | | |
|---|---|---|---|
| 6,300,991 B1 | 10/2001 | Schadt et al. |
| 6,783,349 B2 | 8/2004 | Neavin et al. |
| 6,967,778 B1 | 11/2005 | Wheatley et al. |
| 8,338,823 B2 | 12/2012 | Kim et al. |
| 8,969,857 B2 | 3/2015 | Kim et al. |
| 9,162,406 B2 | 10/2015 | Neavin et al. |
| 9,773,847 B2 | 9/2017 | Epstein et al. |
| 9,971,191 B2 | 5/2018 | Cho et al. |
| 10,185,068 B2 | 1/2019 | Johnson et al. |
| 10,466,398 B2 | 11/2019 | Johnson et al. |
| 2002/0180916 A1 | 12/2002 | Schadt et al. |
| 2003/0028048 A1 | 2/2003 | Cherkaoui et al. |
| 2005/0072959 A1 | 4/2005 | Moia et al. |
| 2006/0197068 A1 | 9/2006 | Schadt et al. |
| 2007/0247573 A1 | 10/2007 | Ouderkirk et al. |
| 2010/0002296 A1 | 1/2010 | Choi et al. |

FOREIGN PATENT DOCUMENTS

| | | |
|---|---|---|
| KR | 100508526 B1 | 8/2005 |
| KR | 100529050 B1 | 11/2005 |
| KR | 100549853 B1 | 2/2006 |
| KR | 20150039300 A | 4/2015 |
| KR | 20150101106 A | 9/2015 |
| WO | 2014197539 A1 | 12/2014 |
| WO | 2015085114 A1 | 6/2015 |
| WO | 2020051874 A1 | 3/2020 |
| WO | 2021059191 A1 | 4/2021 |

REFLECTIVE POLARIZER AND DISPLAY SYSTEM

CROSS REFERENCE TO RELATED APPLICATIONS

This application is a national stage filing under 35 U.S.C. 371 of PCT/IB2021/051819, filed Mar. 4, 2021, which claims the benefit of Provisional Application No. 62/986,869, filed Mar. 9, 2020, the disclosures of which are incorporated by reference in their entirety herein.

BACKGROUND

Organic light emitting diode (OLED) displays typically include a circular polarizer to reduce reflection of ambient light from the display.

SUMMARY

In some aspects of the present disclosure, a display system for displaying an image to a viewer is provided. The display system includes a display panel including a plurality of at least blue, green and red light emitting pixels having respective blue, green and red emission spectra including respective blue, green and red emission peaks at respective blue, green and red peak wavelengths with respective blue, green and red full width at half maxima (FWHMs); and a reflective polarizer disposed on the plurality of the at least blue, green and red light emitting pixels. For substantially normally incident light, the reflective polarizer has a reflection spectrum including substantially distinct blue, green and red-infrared reflection bands. The reflective polarizer: reflects at least about 60% of the incident light for each of the blue and green peak wavelengths and at least about 40% of the incident light for the red peak wavelength for a first polarization state; transmits at least about 60% of the incident light for each of the blue, green and red peak wavelengths for an orthogonal second polarization state; and has an absorption peak at a wavelength between the green and red FWHMs of the respective green and red emission spectra. For the first polarization state and when the incidence angle increases from zero to at least about 50 degrees, the reflectance of the reflective polarizer decreases for each of the blue and green peak wavelengths, and for the red peak wavelength, increases or does not decrease by more than about 10%.

In some aspects of the present disclosure, a display system is provided. The display system includes a display panel including a plurality of red light emitting pixels each having a red emission spectrum including a red emission peak at a red peak wavelength; and a plurality of white light emitting pixels each having a white emission spectrum including first and second white emission peaks in respective generally blue and green regions of the spectrum at respective first and second white peak wavelengths. The display system includes a reflective polarizer disposed on the pluralities of white and red light emitting pixels, such that for substantially normally incident light, the reflective polarizer has a reflection spectrum including substantially distinct blue, green and red-infrared reflection bands. The reflective polarizer: reflects for a first polarization state, at least about 60% of the incident light for the first white peak wavelength, and at least about 40% of the incident light for each of the second white and red peak wavelengths; transmits for an orthogonal second polarization state, at least about 60% of the incident light for each of the first white, second white, and red peak wavelengths; and has an absorption peak at a wavelength between the second white and red peak wavelengths. For the first polarization state and when the incidence angle increases from zero to at least about 50 degrees, the reflectance of the reflective polarizer decreases for each of the first and second white peak wavelengths, and for the red peak wavelength, increases or does not decrease by more than about 10%.

In some aspects of the present disclosure, a reflective polarizer including a plurality of alternating polymeric layers is provided. For substantially normally incident light, the reflective polarizer has a reflection spectrum including substantially distinct blue, green and red-infrared reflection bands with respective blue, green and red-infrared full width at half maxima (FWHMs). For the substantially normally incident light and for red, green and blue wavelengths, the reflective polarizer: reflects at least about 60% of the incident light for each of the blue and green wavelengths and at least about 40% of the incident light for the red wavelength for a first polarization state; transmits at least about 60% of the incident light for each of the blue, green and red wavelengths for an orthogonal second polarization state; and has an absorption peak at a wavelength between the green and red-infrared FWHMs. For the first polarization state and when the incidence angle increases from zero to about 50 degrees, the reflectance of the reflective polarizer decreases for each of the blue and green wavelengths by at least about 20%, and for the red wavelength, increases or does not decrease by more than about 10%.

These and other aspects will be apparent from the following detailed description. In no event, however, should this brief summary be construed to limit the claimable subject matter.

DETAILED DESCRIPTION

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

It has been found that the reflective polarizers described herein, according to some embodiments, are useful for improving performance of a display system when the reflective polarizer is disposed to receive a light output of a display panel. For example, in some embodiments, the reflective polarizer can be used in a circular polarizer disposed on an organic light emitting diode (OLED) display, or other emissive display, to improve the color gamut of the display without causing significant ghosting or other image degradations. Utilizing a broadband reflective polarizer in the circular polarizer of an OLED display for increasing the brightness of the display due to light recycling is described in U.S. Pat. No. 9,773,847 (Epstein et al.). As described in International Pat. Appl. No. CN2018/105712 (Xu et al.), it has been found that utilizing a notch reflective polarizer having band edges in the visible spectrum can increase the brightness and/or the color gamut of the display while producing substantially less ghosting compared to using a broadband reflective polarizer and/or producing a reduced reflection of ambient light compared to using a broadband reflective polarizer. According to some embodiments of the present description, it has been found that using blue, green and red-infrared reflection bands with absorption between the green and red-infrared reflection band can provide an improved color gamut and/or reduced ghosting compared to using a notch reflective polarizer without absorption and/or compared to using a broadband reflective polarizer with absorption. It has further been found that using a red-infrared reflection band that extends into the infrared at normal incidence improves the color of light emitted at off-normal viewing angles (e.g., reducing a color shift of white-point light output with viewing angle).

Figure 1:
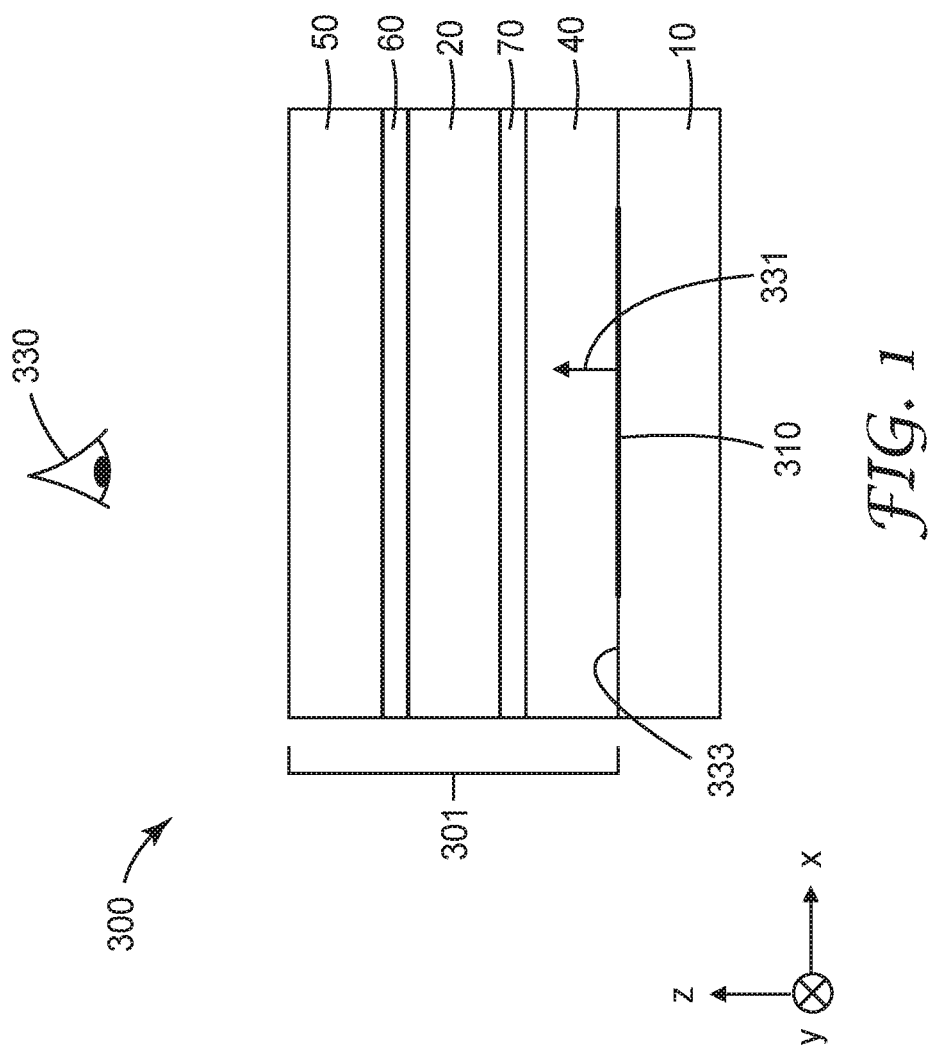
FIG. 1 is a schematic cross-sectional view of an illustrative display system.

FIG. 1 is a schematic cross-sectional view of an illustrative display system 300 including a display panel 10 and a reflective polarizer 20 disposed on the display panel 10, according to some embodiments. The display system 300 can be adapted to display an image 310 to a viewer 330. The reflective polarizer 20 is disposed to receive light 331 emitted by the display panel 10. The display system 300 can further include an absorbing polarizer 50 disposed (e.g., indirectly) on the display panel 10 and a retarder layer 40 disposed between the absorbing polarizer 50 and the display panel 10. In some embodiments, a first adhesive layer 60 bonds the absorbing polarizer 50 to the reflective polarizer 20, and a second adhesive layer 70 bonds the reflective polarizer 20 to the retarder layer 40. The reflective polarizer and the absorbing polarizer, which can be a linear absorbing polarizer, can have substantially aligned pass axes (e.g., aligned to within 20 degrees, or within 10 degrees, or within 5 degrees). In some embodiments, an antireflection coating is disposed on the absorbing polarizer 50 opposite the first adhesive layer 60. In some embodiments, a glass layer is disposed over the absorbing polarizer 50 and the antireflection coating is disposed on the glass layer opposite the absorbing polarizer 50. Additional layer(s), such as an adhesive layer, can be disposed between the retarder layer 40 and the display panel 10, or the retarder layer 40 can be disposed directly on the display panel 10, for example.

For any of the reflective polarizers described herein, an optical stack can include the reflective polarizer and at least one of a retarder layer and an absorbing polarizer. In the embodiment schematically illustrated in FIG. 1, the optical stack 301 includes a retarder layer 40, an absorbing polarizer 50, and the reflective polarizer 20 disposed between the absorbing polarizer 50 and the retarder layer 40. The display system 300 includes a display panel 10 and the optical stack 301 disposed on an emissive surface 333 of the display panel 310 with the retarder layer 40 facing the emissive surface 333.

Figure 2:
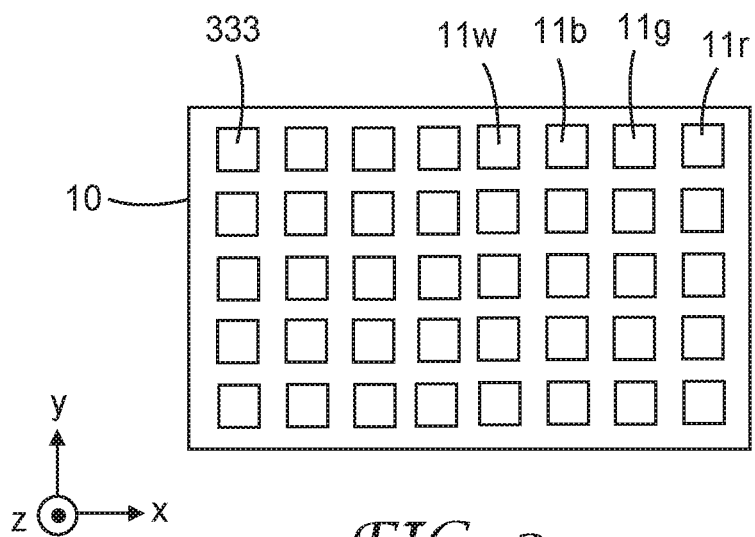
FIG. 2 is a schematic top view of an illustrative display panel.

FIG. 2 is a schematic top view of an illustrative display panel 10. In some embodiments, the display panel 10 includes a plurality of at least blue light emitting pixels 11b. In some embodiments, the display panel 10 includes a plurality of at least blue 11b, green 11g, and red 11r light emitting pixels. In some embodiments, the display panel 10 further includes a plurality of white light emitting pixels 11w. In some embodiments, the display panel 10 includes a plurality of at least white 11w and red 11r light emitting pixels. In some embodiments, the display panel 10 can be or include an organic light emitting diode (OLED) display panel, for example. In other embodiments, the display panel 10 can be or include a micro-LED display panel, for example.

Figure 3:
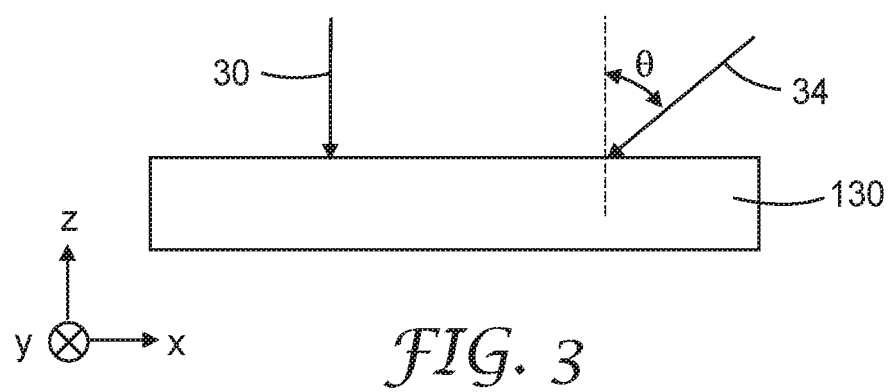
FIG. 3 is a schematic cross-sectional view of a light incident on an object.

In some embodiments, various layers or elements of a display system can be characterized by the optical reflectance, transmittance, and/or absorbance of the layer or element. FIG. 3 is a schematic cross-sectional view of a light 30 and a light 34 incident on a layer or element or system 130. Light 30 is substantially normally incident on the layer or element or system 130 and light 34 is incident on the layer or element or system 130 at an angle of incidence θ. The layer or element or system 130 can represent the reflective polarizer 20 or the absorbing polarizer 50 or the display system 300, for example. A portion of the light 30 can be transmitted, a portion of the light 30 can be reflected, and a portion of the light 30 can be absorbed. In some embodiments, for substantially normally incident light 30 (e.g., within 20 degrees, or within 10 degrees, or within 5 degrees of normally incident), the reflective polarizer 20 reflects at least about 50%, or at least about 60% or at least about 70% of the incident light 30 for at least one wavelength for a first polarization state (e.g., polarized along the x-direction), and transmits at least about 50%, or at least about 60%, or at least about 70% of the incident light for the at least one wavelength for an orthogonal second polarization state (e.g., polarized along the y-direction). In some embodiments, for substantially normally incident light 30, the absorbing polarizer 50 absorbs at least 60% or at least 70% of the incident light 30 for at least one wavelength for a first polarization state (e.g., polarized along the x-direction).

Figure 4:
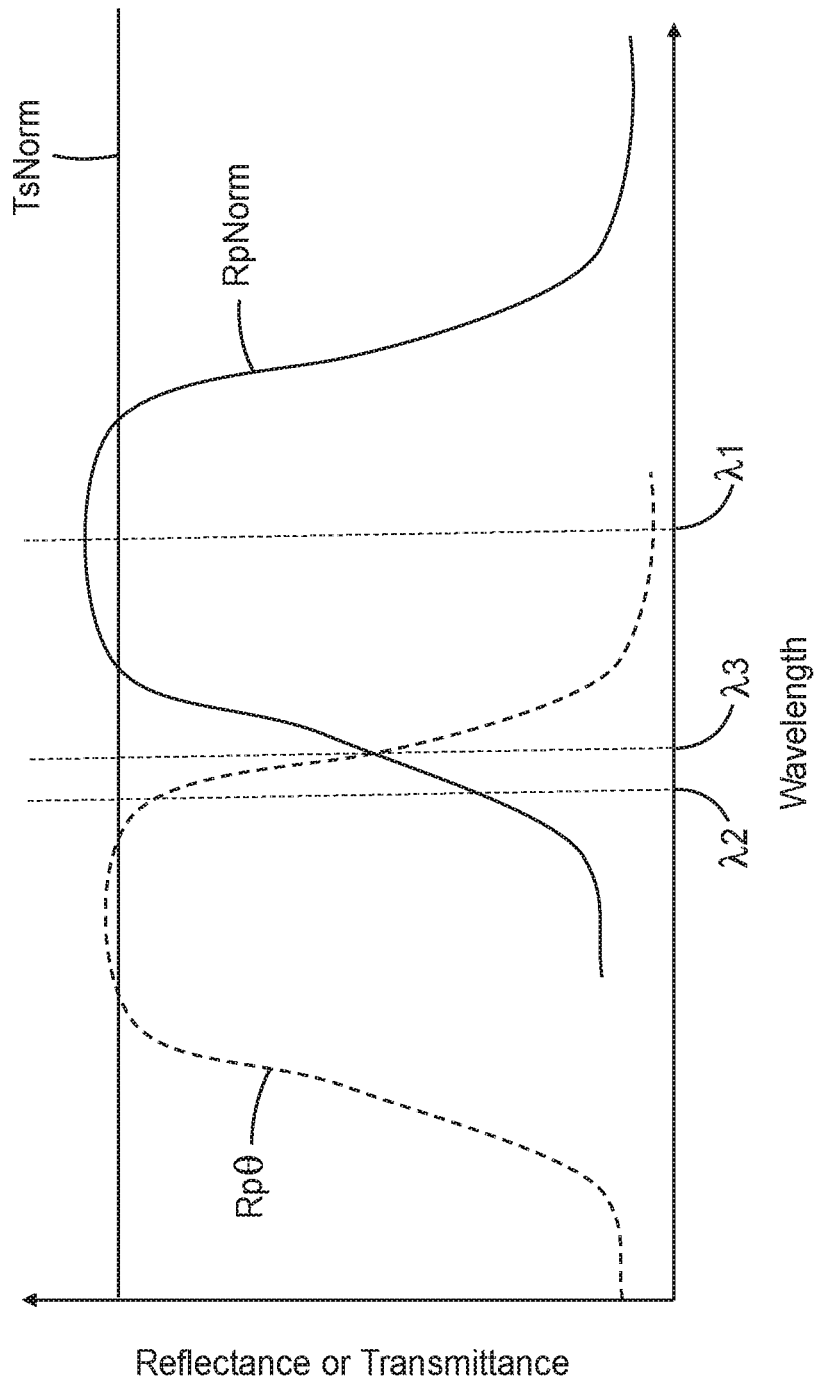
FIG. 4 is a schematic plot of an illustrative reflection band of a reflective polarizer.

FIG. 4 is a schematic illustration of a reflection band of a reflective polarizer at normal incidence (RpNorm) and at an incidence angle θ (Rpθ). The reflectance versus wavelength is shown for a first polarization state (block polarization state) which can be a p-polarization state. Also shown is the transmittance in an orthogonal second polarization state (pass state) for normal incidence light (TsNorm). The incidence angle θ can be at least about 50 degrees (e.g., about 50 degrees, about 60 degrees, or about 70 degrees). In some embodiments, the incidence angle θ is in a range of about 50 degrees to about 70 degrees. For the first polarization state and when the incidence angle increases from zero to θ, the reflectance of the reflective polarizer decreases at the wavelength λ1, increases at the wavelength λ2, and stays the same at the wavelength λ3. The reflection band can be a blue, green, or red-infrared reflection band, for example. A red-infrared reflection band includes red wavelengths (less than 700 nm) and infrared wavelengths (greater than 700 nm).

Figure 5:
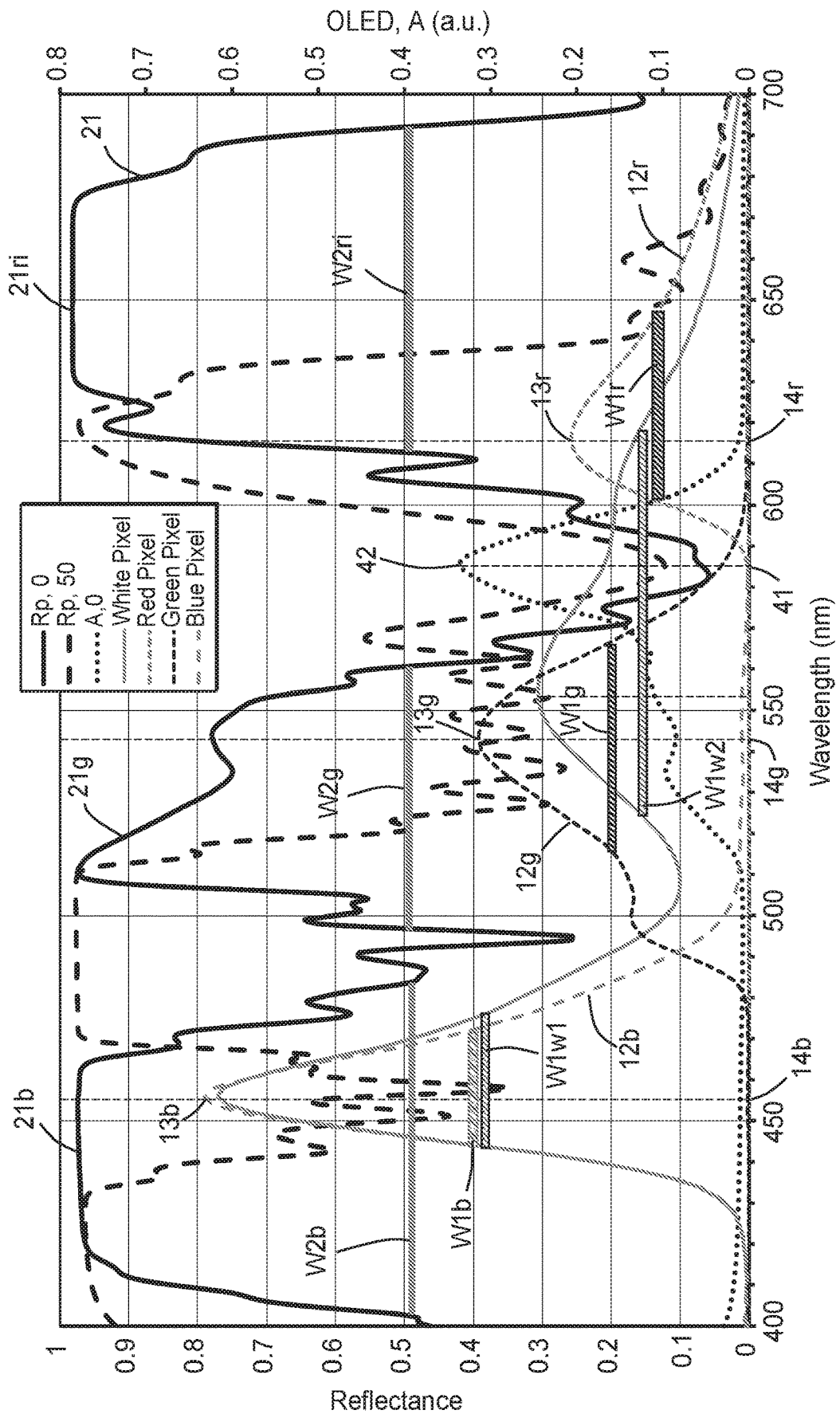
FIGS. 5-6 are plots of reflectance of an illustrative reflective polarizer versus wavelength.
Figure 6:
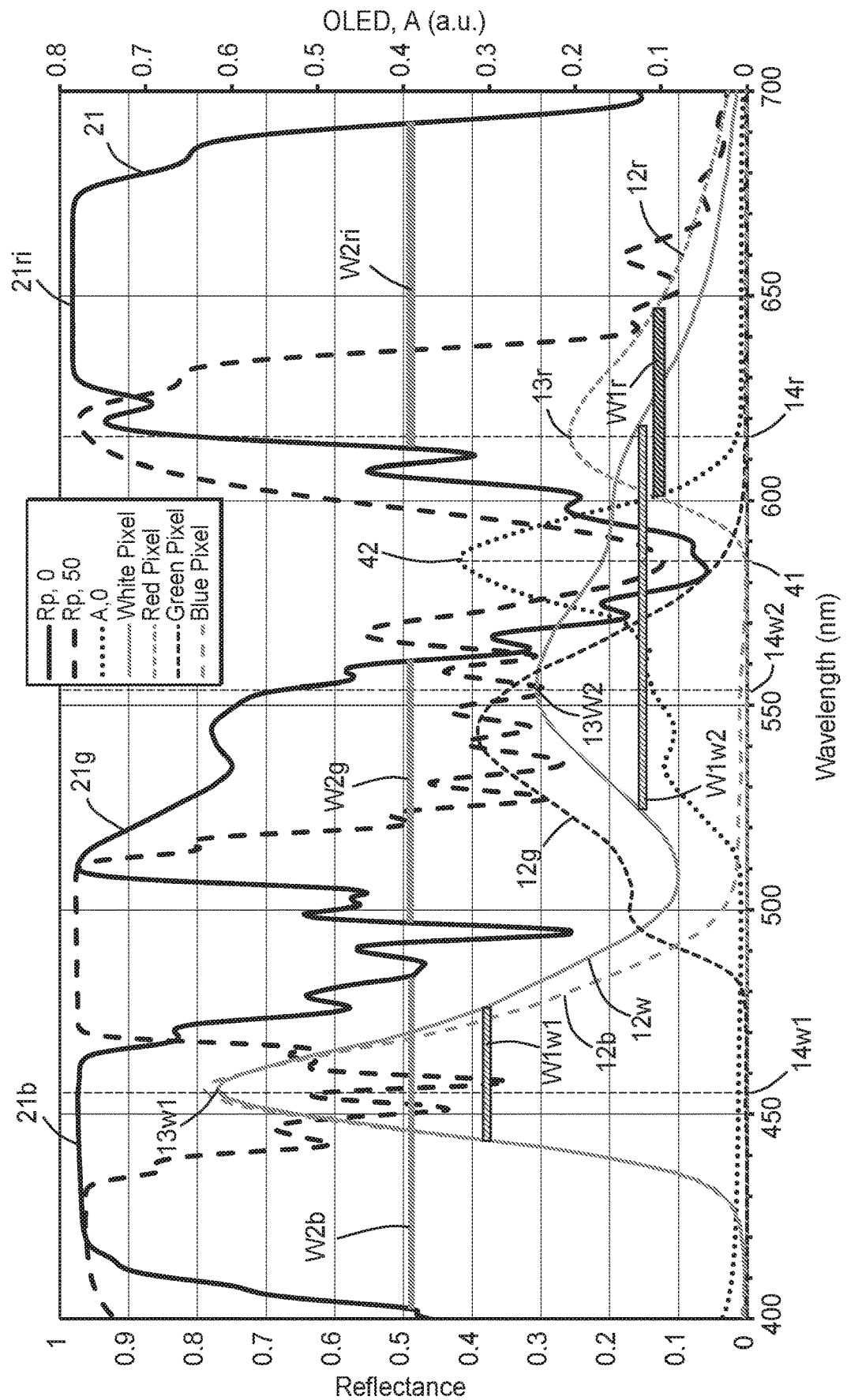
Figure 7:
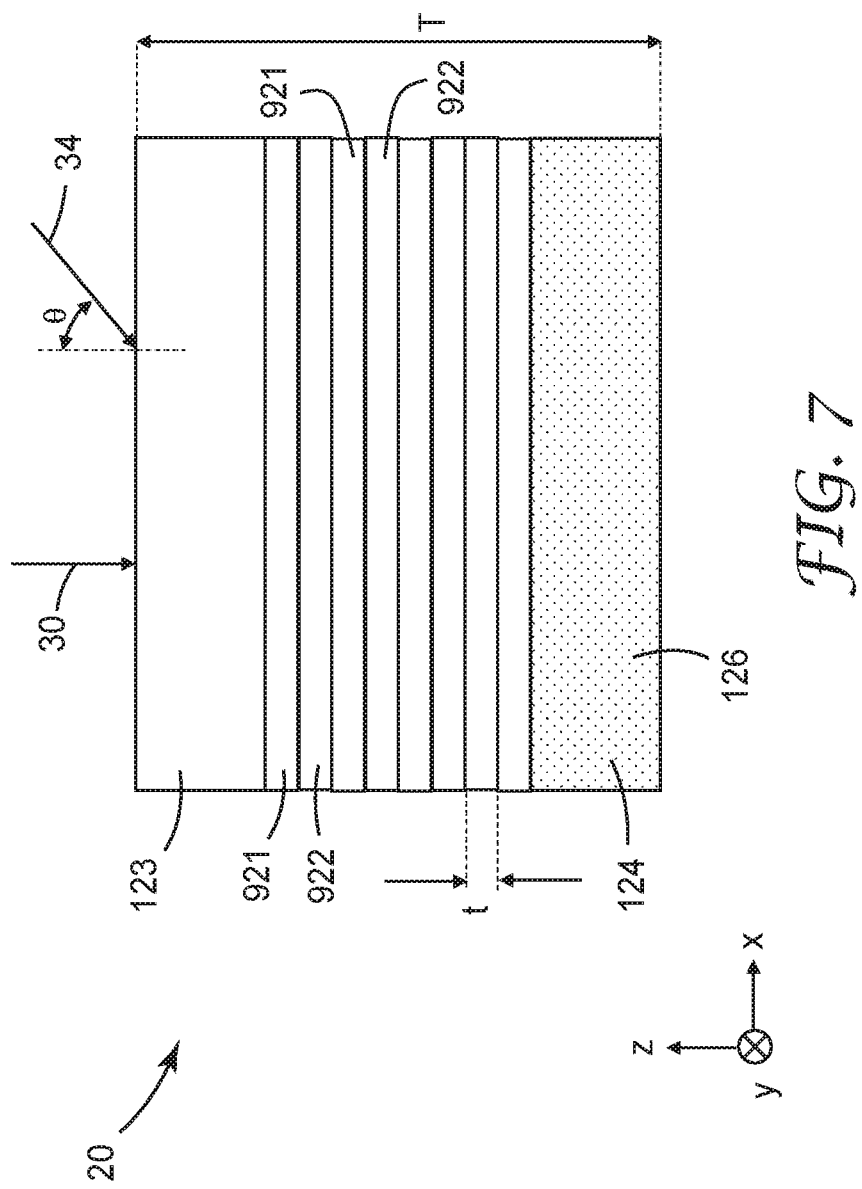
FIG. 7 is a schematic cross-sectional view of an illustrative reflective polarizer.

FIGS. 5-6 are plots of reflectance of an illustrative reflective polarizer versus wavelength where the reflective polarizer has an absorption A with an absorption peak 42 and where OLED emission spectra for white, red, green, and blue pixels are shown on the plots. The absorption A and emission spectra are in arbitrary units (a.u.). Full width at half maxima of reflection bands of the reflective polarizer and of the emission spectra of pixels are schematically illustrated. The reflectance is shown for normally incident light in the first (block) polarization state (Rp, 0) and for light in the first polarization state at an incident angle of 50 degrees (Rp, 50). The absorption A is for normally incident unpolarized light (A, 0).

In some embodiments, a display system 300 for displaying an image 310 to a viewer 330 includes a display panel 10 including a plurality of at least blue (11*b*), green (11*g*) and red (11*r*) light emitting pixels and a reflective polarizer 20 disposed on the plurality of the at least blue, green and red light emitting pixels. The plurality of at least blue (11*b*), green (11*g*) and red (11*r*) light emitting pixels have respective blue (12*b*), green (12*g*) and red (12*r*) emission spectra including respective blue (13*b*), green (13*g*) and red (13*r*) emission peaks at respective blue (14*b*), green (14*g*) and red (14*r*) peak wavelengths with respective blue (W1*b*), green (W1*g*) and red (W1*r*) full width at half maxima (FWHMs). The reflective polarizer 20 is such that for substantially normally incident light 30, the reflective polarizer has a reflection spectrum 21 including substantially distinct blue (21*b*), green (21*g*) and red-infrared (21*ri*) reflection bands with respective blue (W2*b*), green (W2*g*) and red-infrared (W2*ri*) FWHMs. For the substantially normally incident light 30, the reflective polarizer: reflects at least about 60% of the incident light 30 for each of the blue (14*b*) and green (14*g*) peak wavelengths and at least about 40% of the incident light for the red peak wavelength 14*r* for a first polarization state (e.g., polarized along the x-axis); transmits at least about 60% of the incident light 30 for each of the blue, green and red peak wavelengths for an orthogonal second polarization state (e.g., polarized along the y-axis); and has an absorption peak 42 at a wavelength 41 between the green (W1*g*) and red (W1*r*) FWHMs of the respective green (12*g*) and red (12*r*) emission spectra. For the first polarization state and when the incidence angle θ increases from zero to at least about 50 degrees, the reflectance of the reflective polarizer 20 decreases for each of the blue (14*b*) and green (14*g*) peak wavelengths, and for the red peak wavelength 14*r*, increases or does not decrease by more than about 10%. In some embodiments, for the first polarization state and when the incidence angle θ increases from zero to at least about 50 degrees, the reflectance of the reflective polarizer 20 decreases for each of the blue (14*b*) and green (14*g*) peak wavelengths by more than about 20%, or more than about 30%, or more than about 40% (e.g., the reflectance can decrease from 0.9 (or 90%) to 0.6 (or 60%) which is about a 33.3% decrease). In some embodiments, for the first polarization state and when the incidence angle θ increases from zero to at least about 50 degrees, the reflectance of the reflective polarizer 20 increases (e.g., by at least about 5% or at least about 10%) for the red peak wavelength 14*r*. The incidence angle of at least about 50 degrees can be about 50 degrees or can be any of the angles or ranges described elsewhere (e.g., about 50 to about 70 degrees).

The FWHM W2*b* of the blue reflection band 21*b* can at least partially overlap the FWHM W1*b* of the blue emission spectrum 12*b*. Alternatively, or in addition, the FWHM W2*g* of the green reflection band 21*g* can at least partially overlap the FWHM W*ig* of the green emission spectrum 12*g*. Alternatively, or in addition, the FWHM W2*ri* of the red-infrared reflection band 21*ri* can at least partially overlap the FWHM W1*r* of the red emission spectrum 12*r*.

Substantially distinct reflection bands can be distinct or recognizably different from each other where the reflection spectrum has regions of relatively low reflectance separating adjacent reflection bands having regions of relatively high reflectance. In some embodiments, for substantially normally incident light and for the first polarization state (block state), the reflective polarizer has a reflectance greater than about 90% for at least one wavelength in each of the blue, green and red-infrared reflection bands and has a reflectance less than about 40% for at least one wavelength between the blue and green FWHMs and for at least one wavelength between the green and red-infrared FWHMs.

The display panel 10 can further include a plurality of white light emitting pixels 11*w* each having a white emission spectrum 12*w* including first (13*w*1) and second (13*w*2) white emission peaks in respective generally blue and green regions of the spectrum at respective first (14*w*1) and second (14*w*2) white peak wavelengths. A generally blue region of the spectrum is a region between about 400 nm and about 500 nm. A generally green region of the spectrum is a region between about 500 nm and about 600 nm. In some embodiments, a display system 300 includes a display panel 10 including a plurality of red 11*r* light emitting pixels 11*r* each having a red emission spectrum 12*r* including a red emission peak 13*r* at a red peak wavelength 14*r*; and a plurality of white light emitting pixels 11*w* each having a white emission spectrum 12*w* including first (13*w*1) and second (13*w*2) white emission peaks in respective generally blue and green regions of the spectrum at respective first (14*w*1) and second (14*w*2) white peak wavelengths. The display system 300 includes a reflective polarizer 20 disposed on the pluralities of white (11*w*) and red (11*r*) light emitting pixels, such that for substantially normally incident light 30, the reflective polarizer has a reflection spectrum 21 including substantially distinct blue (21*b*), green (21*g*) and red-infrared (2*ri*) reflection bands. For the substantially normally incident light 30, the reflective polarizer: reflects for a first polarization state (e.g., polarized along the x-axis), at least about 60% of the incident light for the first white peak wavelength 14*w*1, and at least about 40% of the incident light for each of the second white (14*w*2) and red (14*r*) peak wavelengths; transmits for an orthogonal second polarization state (e.g., polarized along the y-axis), at least about 60% of the incident light for each of the first white (14*w*1), second white (14*w*2), and red (14*r*) peak wavelengths; and has an absorption peak 42 at a wavelength 41 between the second white (14*w*2) and red (14*r*) peak wavelengths. For the first polarization state and when the incidence angle increases from zero to at least about 50 degrees, the reflectance of the reflective polarizer 20 decreases for each of the first (14*w*1) and second (14*w*2) white peak wavelengths, and for the red peak wavelength 14*r*, increases or does not decrease by more than about 10%. In some embodiments, for the first polarization state and when the incidence angle increases from zero to at least about 50 degrees, the reflectance of the reflective polarizer 20 decreases for each of the first (14*w*1) and second (14*w*2) white peak wavelengths by more than about 20%, or more than about 30%, or more than about 40%. In some embodiments, for the first polarization state and when the incidence angle increases from zero to at least about 50 degrees, the reflectance of the reflective polarizer 20 increases (e.g., by at least about 5% or at least about 10%) for the red peak wavelength. The incidence angle of at least about 50 degrees can be about 50 degrees or can be any of the angles or ranges described elsewhere (e.g., about 50 to about 70 degrees).

The white emission spectrum 12*w* includes first (13*w*1) and second (13*w*2) white emission peaks at respective first (14*w*1) and second (14*w*2) white peak wavelengths with respective first (W1*w*1) and second (W1*w*2) FWHMs. The FWHM W2*b* of the blue reflection band 21*b* can at least partially overlap the first FWHM W1*w*1 of the white emission spectrum 12w. Alternatively, or in addition, the FWHM W2g of the green reflection band 21g can at least partially overlap the second FWHM W1w2 of the white emission spectrum 12w. Alternatively, or in addition, the FWHM W2ri of the red-infrared reflection band 21ri can at least partially overlap the FWHM W1r of the red emission spectrum 12r. Alternatively, or in addition, the FWHM W2ri of the red-infrared reflection band 2ri can partially overlap the second FWHM W1w2 of the white emission spectrum 12w.

It has been found that a reflective polarizer including blue, green and red-infrared reflection bands such that for the first polarization state and when the incidence angle increases from zero to at least about 50 degrees, the reflectance of the reflective polarizer decreases for each of the blue and green peak wavelengths, and/or for each of the first and second white peak wavelengths, and increases or remains about the same (e.g., decreases by no more than about 10%) for the red peak wavelength, results in a reduced color shift with view angle for a substantially white light output of an emissive display (e.g., OLED), for example. This can be due to a relative increase in recycling of red light and a relative decrease in recycling of blue and green light at higher viewing angles.

It has been found that a reflective polarizer including an absorption peak between the green and red peak wavelengths, and/or between the second white and red peak wavelengths, and/or between the green and red-infrared FWHMs of the respective green and red-infrared reflection bands results in an improved color gamut of an emissive display (e.g., OLED), for example. This can be due to sharpening a distinction between green pixel emission and/or emission of white pixels in the green region of the spectrum and emission of red pixels.

The reflective polarizer 20 can be a multilayer polymeric reflective polarizer. Multilayer polymeric reflective polarizers are known in the art and are described in U.S. Pat. No. 5,882,774 (Jonza et al.); U.S. Pat. No. 6,179,948 (Merrill et al.); U.S. Pat. No. 6,783,349 (Neavin et al.); U.S. Pat. No. 6,967,778 (Wheatley et al.); and U.S. Pat. No. 9,162,406 (Neavin et al.), for example. FIG. 4 is a schematic cross-sectional view of a reflective polarizer 20 according to some embodiments. The reflective polarizer 20 can include a plurality of alternating polymeric first (921) and second (922) layers which are arranged sequentially along the z-direction (thickness direction). The thicknesses profile (different thicknesses of the different layers) of the first and second layers can be selected to provide desired reflection band(s), as is known in the art. In some embodiments, the reflective polarizer 20 has an average thickness T (unweighted mean thickness over an entire area of the reflective polarizer) less than about 50 micrometers or less than about 30 micrometers. In some such embodiments or in other embodiments, the average thickness T is greater than about 10 micrometers or greater than about 15 micrometers. In some embodiments, the plurality of alternating polymeric first and second layers number at least 30 in total (e.g., 50 to 500 layers or 50 to 300 layers), and an average thickness t of each first and second layer is less than about 500 nm, or less than about 400 nm, or less than about 300 nm. In some embodiments, the reflective polarizer 20 further includes skin layer(s) 123, 124 at outermost major surface(s) of the reflective polarizer 20. The skin layer(s) 123, 124 can have a thickness greater than about 1 micrometer (e.g., 2 to 20 micrometers), for example. One or both of the skin layer(s) 123, 124 can include dye(s) 126. Alternatively, the dye(s) 126 can be disposed in a separate coating on one or both of the skin layer(s) 123, 124. In some embodiments, the reflective polarizer 20 can further include protective boundary layer(s) disposed between packets of alternating first and second layers. Dye(s) can optionally be included int the protective boundary layer(s). A substantially normally incident light 30 and a light 34 incident on the reflective polarizer at an incidence angle θ are schematically illustrated.

The absorption peak 42 can be obtained by including (e.g., yellow absorbing) dye(s) in a skin layer 123 or protective boundary layer in a reflective polarizer, or in the first (921) layers or second (922) layers of a reflective polarizer including alternating first and second layers, or in a coating applied to an outer surface of the reflective polarizer. According to some embodiments, it has been found that including absorption between the green peak wavelength 14g or the second white peak wavelength 14w2 and the red peak wavelength 14r sharpens the distinction between green and red emissions and increases the color gamut of the display. According to some embodiments, the dye(s) are included in a skin layer or a coating facing the absorbing polarizer 50 as this has been found to give an improved color gamut compared to disposing the dye(s) on the opposite side of the reflective polarizer 20. According to some other embodiments, the dye(s) are included in a skin layer or a coating facing the retarder layer 40 as this has been found to give reduced ghosting compared to disposing the dye(s) on the opposite side of the reflective polarizer 20. Additional absorption peak(s) (e.g., a cyan peak between the blue and green peak emission wavelengths or between the first and second white peak emission wavelengths; and/or an ultraviolet (UV), magenta or bright blue peak below the blue peak emission wavelength or below the first white peak emission wavelength) can also be included by a suitable selection of dye(s). In some embodiments, the dye(s) are dichroic dyes that can be oriented when the reflective polarizer film is oriented so that the dyes primarily absorb light having the first, but not the second, polarization state. Alternatively, the dye(s) can absorb both polarization states. Useful dyes may include a tetra aza porphyrin (TAP)-based absorption dye, a rhodamine-based absorption dye, a squaraine (SQ)-based absorption dye, and a cyanine (CY)-based absorption dye. Useful dichroic dyes include those available from Mitsui Fine Chemicals (Tokyo, Japan) such as PD-325H, PD-335H, PD-104 and PD-318H, for example. Other useful dyes are described in U.S. Pat. Nos. 10,466,398 (Johnson et al.) and 9,971,191 (Cho et al.), for example.

Figure 8:
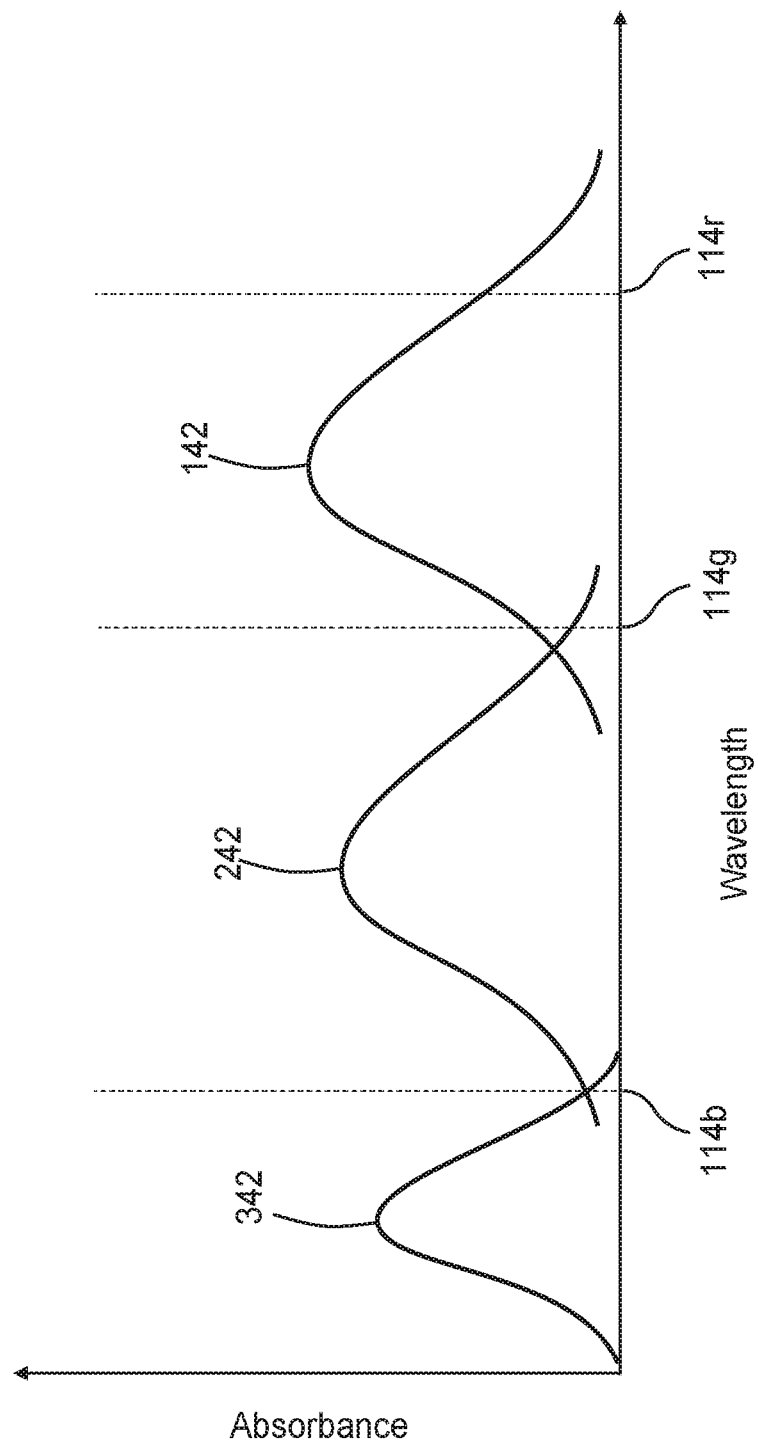
FIG. 8 is a schematic plot of absorbance versus wavelength for dye(s) included in a reflective polarizer.

FIG. 8 is a schematic plot of absorbance versus wavelength for dye(s) included in a reflective polarizer according to some embodiments. An absorption peak 142, which may correspond to absorption peak 42, is disposed between green and red wavelengths 114g and 114r, an absorption peak 242 is disposed between blue and green wavelengths 114b and 114g, and an absorption peak 342 is disposed at a wavelength less than the blue wavelength 114b. One or more of the absorption peaks can optionally be omitted. For example, in some embodiments, only the absorption peak 142 is included while in other embodiments, only the absorption peaks 142 and 242 are included. The blue wavelength 114b can correspond to the blue peak wavelength 14b or to the first white peak wavelength 14w1, for example. The green wavelength 114g can correspond to the green peak wavelength 14g or to the second white peak wavelength 14w2, for example. The red wavelength 114r can correspond to the red peak wavelength 14r, for example. The relative strengths of the absorption peaks may be as schematically indicated in FIG. 8 or the relative strengths may be different.

In some embodiments, the reflective polarizer absorbs at least 10%, or at least 20%, or at least 30% of substantially normally incident light having the first polarization state (block state) at the wavelength of any one or more of the absorption peaks 142, 242 and 342. In some embodiments, the reflective polarizer transmits at least 10%, or at least 20%, or at least 30% of substantially normally incident light having the second polarization state (pass state) at the wavelength of any one or more of the absorption peaks 142, 242 and 342.

In some embodiments, a reflective polarizer 20 includes a plurality of alternating polymeric layers (921, 922), where for substantially normally incident light 30, the reflective polarizer 20 has a reflection spectrum 21 including substantially distinct blue (21b), green (21g) and red-infrared (21ri) reflection bands with respective blue (W2b), green (W2g) and red-infrared (W2ri) FWHMs. For the substantially normally incident light 30 and for red, green and blue wavelengths, the reflective polarizer: reflects at least about 60% of the incident light for each of the blue and green wavelengths and at least about 40% of the incident light for the red wavelength for a first polarization state (e.g., polarized along the x-axis); transmits at least about 60% of the incident light for each of the blue, green and red wavelengths for an orthogonal second polarization state (e.g., polarized along the y-axis); and has an absorption peak 42 at a wavelength 41 between the green (W2g) and red-infrared (W2ri) FWHMs. For the first polarization state and when the incidence angle increases from zero to about 50 degrees, the reflectance of the reflective polarizer 20 decreases for each of the blue and green wavelengths by at least about 20% (or at least about 30% or at least about 40%), and for the red wavelength, increases or does not decrease by more than about 10%. In some embodiments, for the first polarization state and when the incidence angle increases from zero to at least about 50 degrees, the reflectance of the reflective polarizer 20 increases (e.g., by at least about 5% or at least about 10%) for the red wavelength. The incidence angle of at least about 50 degrees can be about 50 degrees or can be any of the angles or ranges described elsewhere (e.g., about 50 to about 70 degrees).

The blue wavelength can be in a range of 400 nm to 500 nm. The blue wavelength can be the blue peak wavelength 14b or the first white peak wavelength 14w1, for example. The green wavelength can be in a range of 500 nm to 600 nm. The green wavelength can be the green peak wavelength 14g or the second white peak wavelength 14w2, for example. The red wavelength can be in a range of 600 nm to 700 nm. The red wavelength can be the red peak wavelength 14r, for example. In some embodiments, the blue wavelength is in the blue FWHM W2b, the green wavelength is in the green FWHM W2g, and the red wavelength is in the red-infrared FWHM W2ri or between the green (W2g) and red-infrared (W2ri) FWHMs. In some such embodiments or in other embodiments, the red wavelength is in a range of 600 to 650 nm, the green wavelength is in a range of 530 to 580 nm, and the blue wavelength is in a range of 430 to 480 nm.

In some embodiments, an optical stack 301 includes the reflective polarizer 20 disposed on a retarder layer 40. In some embodiments, the optical stack 301 further includes an absorbing polarizer 50 disposed on the reflective polarizer 20 opposite the retarder layer 40. The retarder layer 40 can be substantially a quarter wave retarder (e.g., a retardance within 20% or within 10% or within 5% of quarter wave) for at least one wavelength in a range of about 400 nm to about 700 nm). The retarder layer 40 can have a fast axis making an angle of about 45 degrees with the first polarization state (block axis of the reflective polarizer). The retarder layer 40 can include films, coatings or a combination of films and coatings.

Exemplary films include birefringent polymer film retarders, such as those available from Meadowlark Optics (Frederick, CO), for example. Exemplary coatings for forming a retarder layer include the linear photopolymerizable polymer (LPP) materials and the liquid crystal polymer (LCP) materials described in U.S. Pat. App. Pub. Nos. 2002/0180916 (Schadt et al.), 2003/028048 (Cherkaoui et al.), 2005/0072959 (Moia et al.) and 2006/0197068 (Schadt et al.), and in U.S. Pat. No. 6,300,991 (Schadt et al.). Suitable LPP materials include ROP-131 EXP 306 LPP and suitable LCP materials include ROF-5185 EXP 410 LCP, both available from ROLIC Technologies Ltd. (Allschwil, Switzerland).

Figure 9:
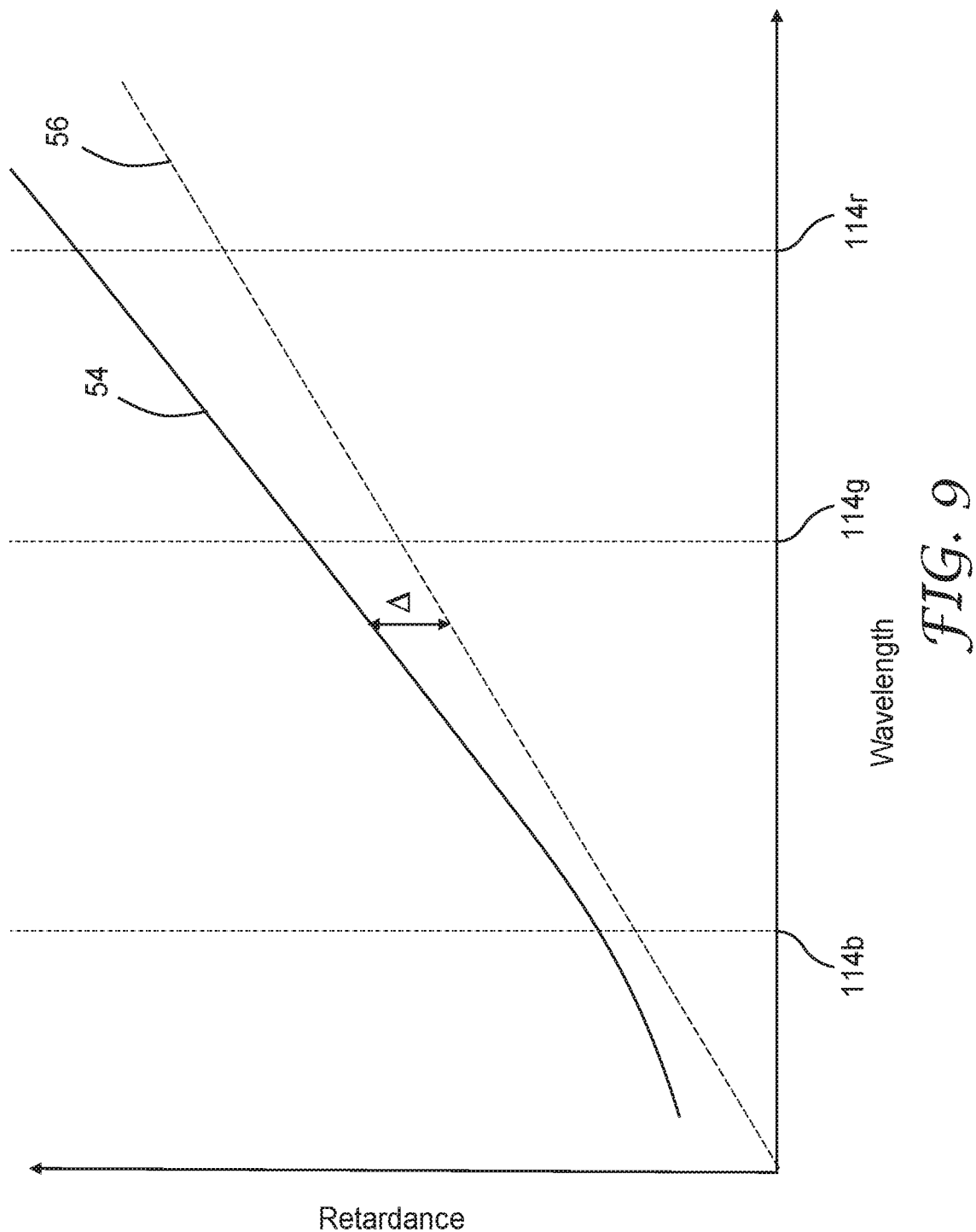
FIG. 9 is a schematic plot of retardance versus wavelength.

FIG. 9 is a schematic plot of retardance versus wavelength illustrating a relationship 56 between wavelength and retardance embodied by an ideal quarter-wave retarder, where wavelength and retardance vary linearly, and illustrating an exemplary relationship 54 between wavelength and retardance for some embodiments of the retarder layer 40. It can be seen that a wavelength-dependent deviation Δ exists between the retarder layer relationship 54 and the ideal quarter-wave relationship 56. In some embodiments, the retarder layer 40 has a smaller deviation Δ from being a quarter-wave retarder at a blue wavelength 114b (e.g., corresponding to the blue peak wavelength 14b or to the first white peak wavelength 14w1) than at a red wavelength 114r (e.g., corresponding to the red peak wavelength 14r). In some embodiments, the retarder layer 40 has a smaller deviation Δ from being a quarter-wave retarder at a blue wavelength 114b than at a green wavelength 114g (e.g., corresponding to the green peak wavelength 14g or the second white peak wavelength 14w2). It has been found that having a retarder layer 40 with a lower deviation Δ for blue wavelengths than for red wavelengths, for example, can result in a reduced color shift with view angle of ambient light reflected from the display. A retarder layer can be selected to have a smaller deviation Δ from being a quarter-wave retarder at a blue wavelength by suitably selecting the thickness of the retarder layer. Suitable retarder layers, and display systems including the retarder layers, are described further in U.S. patent application Ser. No. 62/906,852 filed on Sep. 27, 2019 and titled "COLOR NEUTRAL EMISSIVE DISPLAY WITH NOTCHED REFLECTIVE POLARIZER".

In some embodiments, an optical stack 301 includes a reflective polarizer 20, which can be any reflective polarizer described herein, disposed on a retarder layer 40, where the retarder layer 40 has a smaller deviation Δ from being a quarter-wave retarder for a blue wavelength (e.g., 114b) than for a red wavelength (e.g., 114r). In some such embodiments or in other embodiments, the optical stack 301 further includes an absorbing polarizer 50 disposed on the reflective polarizer 20 opposite the retarder layer 40, such that for substantially normally incident light 30 polarized along the first direction, the absorbing polarizer absorbs at least 60% of the incident light for each of the blue (e.g., 114b), green (e.g., 114g) and red (e.g., 114r) wavelengths, and has transmittances Tb, Tg and Tr for the respective blue, green and red wavelengths, where Tr>Tb and Tg.

Figure 10:
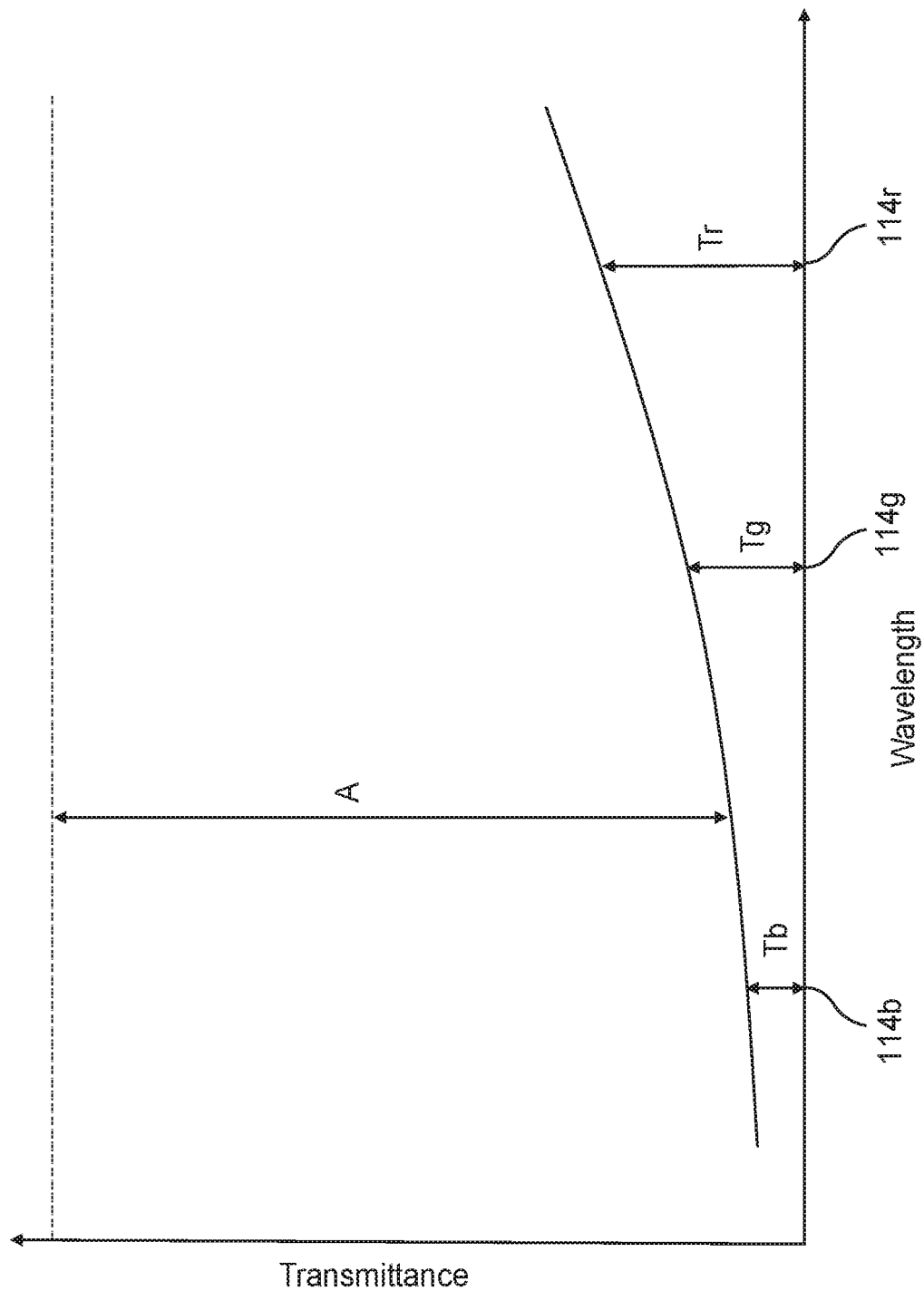
FIG. 10 is a schematic plot of transmittance of an absorbing polarizer versus wavelength.

FIG. 10 is a schematic plot of transmittance of an absorbing polarizer 50 for substantially normally incident light 30 having the first polarization state (e.g., x-axis). In some embodiments, Fresnel reflections are negligible, and the absorbance A of the absorbing polarizer is about 1 (or 100%) minus the transmittance. In some embodiments, the absorbance A is at least 60% or at least 70% throughout the visible range (400 nm to 700 nm) or for each of a blue wavelength 114$b$, a green wavelength 114$g$ and a red wavelength 114$r$. In some embodiments, the display system 300, or the optical stack 301, includes an absorbing polarizer 50 disposed on the reflective polarizer 20 opposite the retarder layer 40, such that for substantially normally incident light having the first polarization state, the absorbing polarizer 50 absorbs at least 60% or at least 70% of the incident light for each of the blue, green and red wavelengths, and has transmittances Tb, Tg and Tr for the blue, green and red wavelengths. In some embodiments, Tr>Tb and Tg (i.e., Tr>Tb and Tr>Tg). In some embodiments, Tr is less than about 30%, or less than about 20%, or less than about 10%. In some embodiments, Tr-Tg is greater than about 5% (or about 0.05). In some embodiments, Tr-Tb is greater than about 5% (or about 0.05) or greater than about 8% (or about 0.08). In some embodiments, the transmittance for substantially normally incident light having the second polarization state is at least 60%, or at least 70%, or at least 80% for each of the blue, green and red wavelengths. The transmission through an absorbing polarizer can be adjusted by suitably selecting the types and concentrations of dichroic dyes, for example, used in the polarizer.

EXAMPLES

A computational model was used to calculate reflection and transmission properties of reflective polarizers. The computational model was driven by a 4×4 matrix solver routine based on the Berriman algorithm where the reflection and transmission matrix elements can be computed for an arbitrary stack of 1-dimensional layers, with each layer defined by its physical thickness and the by a dispersive refractive index tensor where each principal element of the refractive index tensor is a function of wavelength.

A first reflective polarizer (Example 1) having the reflection spectrum depicted in FIGS. 5-6 was modeled. The first reflective polarizer included dyes on a bottom side (side facing the retarder layer when included in a circular polarizer stack) of the reflective polarizer to produce the absorption peak 42. A second reflective polarizer (Example 2) was modeled as being similar to the first reflective polarizer but including the dyes on a top side of the reflective polarizer instead of the bottom side and at about 1.3 times the concentration used in Example 1. For comparison, the same reflective polarizer without any dyes was also modeled (Comparative Example C1) as was a broadband reflective polarizer (DBEF available from 3M Company, St. Paul, MN) including dyes on a top side of the reflective polarizer (Comparative Example C2) as in Example 2.

The first and second reflective polarizers were modeled as including optical repeat units (ORUs) of high index layers of 90/10 coPEN and low index isotropic layers. 90/10 coPEN is a polymer composed of 90% polyethylene naphthalate (PEN) and 10% polyethylene terephthalate (PET). The isotropic layers were modeled as being made with a blend of polycarbonate and copolyesters (PCTg) as described in U.S. Pat. No. 10,185,068 (Johnson et al.) such that the index was about 1.57 at 630 nm and the layers remained substantially isotropic upon uniaxial orientation. The PC:PCTg molar ratio was approximately 85 mol % PC and 15 mol % PCTg. A thickness profile of the microlayers was mathematically generated to produce the reflection spectra shown in FIGS. 5-6. The thickness profile was bounded on both sides by a protective boundary layer of the low index material with a thickness of 2000 nm. Representative values of the refractive index for the high index optical (HIO) layers (90/10 coPEN), denoted Nx, Ny, Nz along the x, y, z axes, respectively, and for the low index optical (LIO) layers (PC:PCTg), denoted Niso for the isotropic index, are shown in the following table:

|  | HIO | | | LIO |
|---|---|---|---|---|
| λ | Nx | Ny | Nz | Niso |
| 450 nm | 1.9222 | 1.6087 | 1.5987 | 1.5962 |
| 530 nm | 1.8611 | 1.5794 | 1.5696 | 1.5801 |
| 630 nm | 1.8266 | 1.5651 | 1.5554 | 1.5701 |

An LG OLED TV was modeled with the original circular polarizer (denoted Ref in the table below) and with the circular polarizer replaced with an optical stack including a reflective polarizer described above disposed between an absorbing polarizer and a quarter wave retarder. The brightness gain for white, blue, green, and red emission; the reflection of substantially normally incident substantially white ambient light; the maximum color shift of substantially white light output determined as the view angle changed from 0 to 60 degrees; the ghosting levels defined as the $1^{st}$ and $2^{nd}$ white and green ghost image brightness of the pixels as a percentage of the pixel brightness; and the percent REC 2020 color gamut were calculated. The color shift was determined as the Euclidean distance in CIE (Commission Internationale de l'Eclairage) 1976 u'v' color coordinates. The $1^{st}$ and $2^{nd}$ ghost images occurred at viewing angles of about 23 and 45 degrees, respectively. The REC 2020 color gamut is defined by the International Telecommunication Union (ITU) Recommendation BT.2020. Results are reported in the following table.

| | Brightness Gain | | | | Amb. Refl. (%) | Max. color shift | Ghosting Level | | | | % REC 2020 |
|---|---|---|---|---|---|---|---|---|---|---|---|
| | | | | | | | $1^{st}$ White (%) | $2^{nd}$ White (%) | $1^{st}$ Gr. (%) | $2^{nd}$ Gr. (%) | |
| Ex. | White | Blue | Gr. | Red | | | | | | | |
| Ref | 1.00 | 1.00 | 1.00 | 1.00 | 0.97 | 0.013 | 0.0 | 0.0 | 0.0 | 0.0 | 69.40 |
| C1 | 1.16 | 1.21 | 1.18 | 1.21 | 2.27 | 0.007 | 6.0 | 7.0 | 4.9 | 6.6 | 71.04 |
| C2 | 1.00 | 1.20 | 1.04 | 1.17 | 2.22 | 0.018 | 8.7 | 8.4 | 9.0 | 8.6 | 72.11 |
| 1 | 0.99 | 1.16 | 1.04 | 1.14 | 1.08 | 0.011 | 4.9 | 5.2 | 4.1 | 5.1 | 72.91 |
| 2 | 0.97 | 1.16 | 1.03 | 1.13 | 2.01 | 0.011 | 6.0 | 6.8 | 5.0 | 6.5 | 73.37 |

Terms such as "about" will be understood in the context in which they are used and described in the present description by one of ordinary skill in the art. If the use of "about"

as applied to quantities expressing feature sizes, amounts, and physical properties is not otherwise clear to one of ordinary skill in the art in the context in which it is used and described in the present description, "about" will be understood to mean within 10 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.9 and 1.1, and that the value could be 1.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations, or variations, or combinations of the specific embodiments discussed herein. Therefore, it is intended that this disclosure be limited only by the claims and the equivalents thereof.

What is claimed is:

1. A display system for displaying an image to a viewer, the display system comprising:
   a display panel comprising a plurality of at least blue, green and red light emitting pixels having respective blue, green and red emission spectra comprising respective blue, green and red emission peaks at respective blue, green and red peak wavelengths with respective blue, green and red full width at half maxima (FWHMs); and
   a reflective polarizer disposed on the plurality of the at least blue, green and red light emitting pixels, such that for substantially normally incident light, the reflective polarizer comprises a reflection spectrum comprising substantially distinct blue, green and red-infrared reflection bands, wherein the reflective polarizer:
      reflects at least about 60% of the incident light for each of the blue and green peak wavelengths and at least about 40% of the incident light for the red peak wavelength for a first polarization state;
      transmits at least about 60% of the incident light for each of the blue, green and red peak wavelengths for an orthogonal second polarization state; and
      has an absorption peak at a wavelength between the green and red FWHMs of the respective green and red emission spectra;
   wherein for the first polarization state and when the incidence angle increases from zero to at least about 50 degrees, the reflectance of the reflective polarizer decreases for each of the blue and green peak wavelengths, and for the red peak wavelength, increases or does not decrease by more than about 10%.

2. The display system of claim 1, wherein the display panel comprises an organic light emitting diode (OLED) display panel.

3. The display system of claim 1, wherein for the first polarization state and when the incidence angle increases from zero to at least about 50 degrees, the reflectance of the reflective polarizer decreases for each of the blue and green peak wavelengths by more than about 20%.

4. The display system of claim 1, wherein for the first polarization state and when the incidence angle increases from zero to at least about 50 degrees, the reflectance of the reflective polarizer increases for the red peak wavelength.

5. The display system of claim 1, wherein the display panel further comprises a plurality of white light emitting pixels each having a white emission spectrum comprising first and second white emission peaks in respective generally blue and green regions of the spectrum at respective first and second white peak wavelengths.

6. The display system of claim 1, further comprising a retarder layer disposed between the reflective polarizer and the display panel, and an absorbing polarizer disposed on the reflective polarizer opposite the retarder layer.

7. A display system comprising:
   a display panel comprising:
      a plurality of red light emitting pixels each having a red emission spectrum comprising a red emission peak at a red peak wavelength; and
      a plurality of white light emitting pixels each having a white emission spectrum comprising first and second white emission peaks in respective generally blue and green regions of the spectrum at respective first and second white peak wavelengths; and
   a reflective polarizer disposed on the pluralities of white and red light emitting pixels, such that for substantially normally incident light, the reflective polarizer comprises a reflection spectrum comprising substantially distinct blue, green and red-infrared reflection bands, wherein the reflective polarizer:
      reflects for a first polarization state, at least about 60% of the incident light for the first white peak wavelength, and at least about 40% of the incident light for each of the second white and red peak wavelengths;
      transmits for an orthogonal second polarization state, at least about 60% of the incident light for each of the first white, second white, and red peak wavelengths; and
      has an absorption peak at a wavelength between the second white and red peak wavelengths;
   wherein for the first polarization state and when the incidence angle increases from zero to at least about 50 degrees, the reflectance of the reflective polarizer decreases for each of the first and second white peak wavelengths, and for the red peak wavelength, increases or does not decrease by more than about 10%.

8. The display system of claim 7, wherein for the first polarization state and when the incidence angle increases from zero to at least about 50 degrees, the reflectance of the reflective polarizer decreases for each of the first and second white peak wavelengths by more than about 20%.

9. The display system of claim 7, wherein for the first polarization state and when the incidence angle increases from zero to at least about 50 degrees, the reflectance of the reflective polarizer increases for the red peak wavelength.

10. A reflective polarizer comprising a plurality of alternating polymeric layers, wherein for substantially normally incident light, the reflective polarizer comprises a reflection spectrum comprising substantially distinct blue, green and red-infrared reflection bands with respective blue, green and red-infrared full width at half maxima (FWHMs), wherein for the substantially normally incident light and for red, green and blue wavelengths, the reflective polarizer:

reflects at least about 60% of the incident light for each of the blue and green wavelengths and at least about 40% of the incident light for the red wavelength for a first polarization state;

transmits at least about 60% of the incident light for each of the blue, green and red wavelengths for an orthogonal second polarization state; and has an absorption peak at a wavelength between the green and red-infrared FWHMs;

wherein for the first polarization state and when the incidence angle increases from zero to about 50 degrees, the reflectance of the reflective polarizer decreases for each of the blue and green wavelengths by at least about 20%, and for the red wavelength, increases or does not decrease by more than about 10%.

11. The reflective polarizer of claim 10, wherein for the first polarization state and when the incidence angle increases from zero to at least about 50 degrees, the reflectance of the reflective polarizer increases for the red wavelength.

12. The reflective polarizer of claim 10, wherein the blue wavelength is in the blue FWHM, the green wavelength is in the green FWHM, and the red wavelength is in the red-infrared FWHM or between the green and red-infrared FWHMs.

13. The reflective polarizer of claim 10, wherein the red wavelength is in a range of 600 to 650 nm, the green wavelength is in a range of 530 to 580 nm, and the blue wavelength is in a range of 430 to 480 nm.

14. An optical stack comprising a retarder layer, an absorbing polarizer, and the reflective polarizer of claim 10 disposed between the absorbing polarizer and retarder layer.

15. A display system comprising a display panel and the optical stack of claim 14 disposed on an emissive surface of the display panel, the retarder layer facing the emissive surface.

* * * * *